United States Patent [19]

Akgun

[11] Patent Number: 4,968,937
[45] Date of Patent: Nov. 6, 1990

[54] MAGNETIC RESONANCE METHODS AND APPARATUS

[75] Inventor: Ali Akgun, Northolt, England

[73] Assignee: Picker International, Ltd, Wembley, England

[21] Appl. No.: 392,541

[22] Filed: Aug. 11, 1989

[30] Foreign Application Priority Data

Aug. 19, 1988 [GB] United Kingdom ............... 8819778

[51] Int. Cl.$^5$ ............................................. G01R 33/20
[52] U.S. Cl. ..................................... 324/318; 324/322
[58] Field of Search ............... 324/300, 307, 309, 310, 324/311, 312, 313, 314, 318, 319, 320, 322; 128/653; 335/216

[56] References Cited

U.S. PATENT DOCUMENTS

| 4,165,479 | 8/1979 | Mansfield | 324/313 |
| 4,506,224 | 3/1985 | Krause . | |
| 4,595,899 | 6/1986 | Smith et al. | 324/320 |
| 4,617,516 | 10/1986 | Schenck | 324/318 |
| 4,680,550 | 7/1987 | Krause . | |
| 4,751,464 | 6/1988 | Bridges | 324/318 |
| 4,752,738 | 6/1988 | Patrick et al. | 324/318 |

FOREIGN PATENT DOCUMENTS 0171741 2/1986 European Pat. Off. .
0304249 2/1989 European Pat. Off. .

OTHER PUBLICATIONS

European Search Report Application No. EP 89 30 7485.

Primary Examiner—Michael J. Tokar
Attorney, Agent, or Firm—Timothy B. Gurin

[57] ABSTRACT

An r.f. antenna for use in a magnetic resonance method or apparatus comprising two sub-systems (17A, 17B) each comprising a relatively large area conductor means (29A, 29B) and a return current path conductor means (33A, 33B) which together act as a transmission line tuned to the frequency of the r.f. The two sub-systems are placed on opposite sides of a body (7) under examination with the large area conductor means in facing relationship, and when used to apply an r.f. field to the body, are excited so that the r.f. currents in the two large area conductor means at any given instant are in opposite directions. The large area conductor means of each sub-system may be planar or convexly or concavely curved, and may comprise a single sheet of conducting material or an array of conducting strips in spaced relationship. The return path conductor means of each sub-system is suitably in the form of one or two strips or wires positioned behind the associated large area conductor means with respect to the other sub-system. Alternatively each return path conductor means may be surrounded by an electrical screen and positioned wherever is convenient.

27 Claims, 11 Drawing Sheets

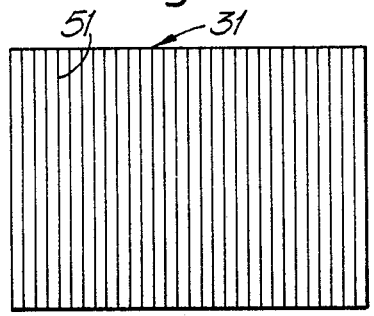
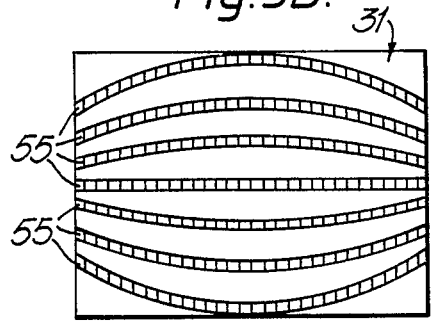
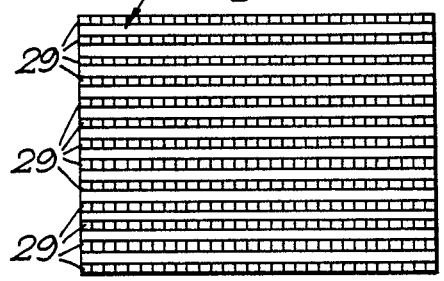
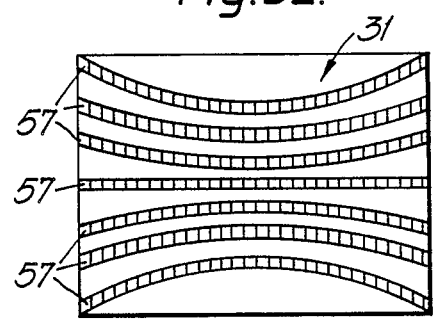
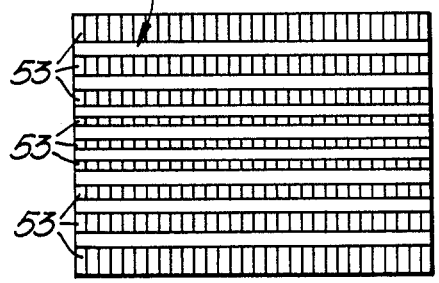

Fig. 6A.
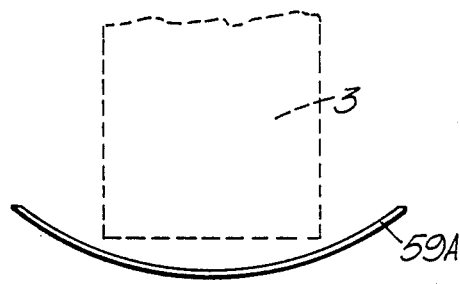
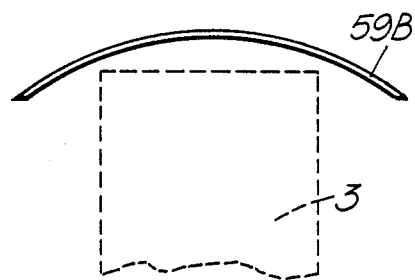
Fig. 6B.
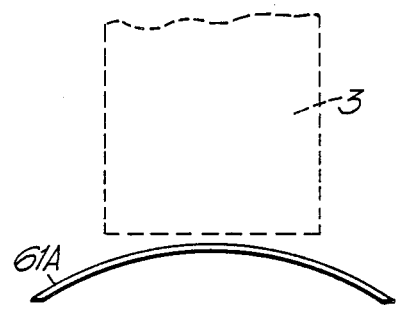
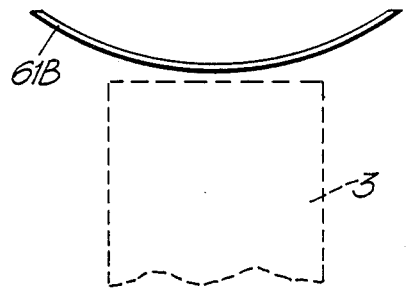

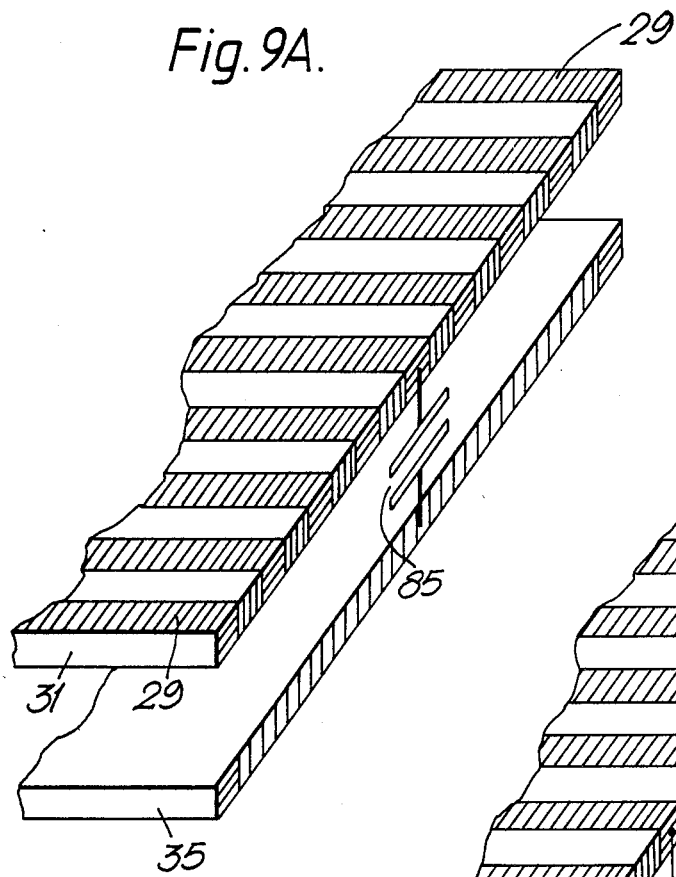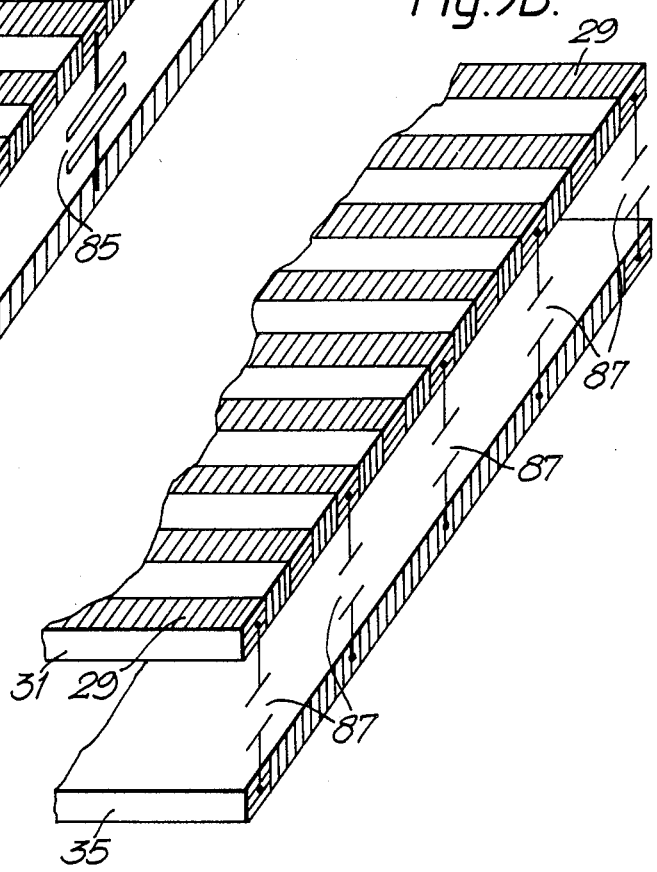

MAGNETIC RESONANCE METHODS AND APPARATUS

This invention relates to magnetic resonance methods and apparatus.

More especially the invention relates to radio frequency (r.f.) antennas for use in such methods and apparatus.

In magnetic resonance methods and apparatus a static magnetic field is applied to a body under investigation to define an equilibrium axis of magnetic alignment in the region of the body being examined. An r.f. field is then applied to the region being examined in a direction orthogonal to the static magnetic field direction to excite magnetic resonance in the region, and resulting r.f. signals are detected and processed. The detected r.f. signals are typically used to produce an image of the region e.g. for medical diagnostic purposes, but may be used alternatively or additionally for other purposes e.g. chemical analysis and well logging.

The exciting r.f. field is applied and the resulting signals are detected by an r.f. antenna system positioned adjacent the body.

For the investigation of relatively large volume bodies, e.g. for medical diagnostic whole-body magnetic resonance imaging, r.f. antenna systems comprising solenoid coils, Helmholtz coils or slotted tube line structures are conventionally employed. Such antenna systems surround the body under investigation in such a manner as to restrict access to the body once it has been positioned in the apparatus for examination.

Such restriction of access may be undesirable, especially in the case of medical diagnostic apparatus when it hampers patient care and management and the use of small r.f. antenna systems for the examination of localised regions of the patient, contributes to patient discomfort, e.g. by giving rise to claustrophobic feelings, and may restrict choice of the orientation of the patient in the static magnetic field and the direction of placement of the patient in the static magnetic field. These disadvantages arise more particularly when the required static magnetic field is produced in a gap between pole pieces of a C, H or four-poster magnet, i.e. a so-called transverse magnet system is employed, which itself does not seriously restrict access to the body under examination, as do other tubular static field magnet systems commonly used in magnetic resonance imaging.

It is an object of the present invention to provide an r.f. antenna system for use in magnetic resonance methods and apparatus whereby these difficulties may be overcome. The invention also provides magnetic resonance methods and apparatus utilising an antenna system according to the invention.

According to a first aspect of the present invention there is provided an r.f. antenna system for use in a magnetic resonance method or apparatus, the antenna system comprising two sub-systems each comprising: current sheet means; first connection means for making electrical connection to one end of said current sheet means; and a return path means for r.f. current extending between second connection means associated with said first connection means and a position adjacent the end of said current sheet means opposite said one end; said two sub-systems being adapted for respective placement on opposite sides of a body under examination with said current sheet means in facing relationship and so that r.f. voltages applied simultaneously between the first and second connection means of said sub-systems cause a current to flow in one said current sheet means which is in the opposite direction to the current caused to flow in the other said current sheet means.

According to a second aspect of the invention there is provided a magnetic resonance apparatus including: means for generating a static magnetic field to define an equilibrium axis of magnetic alignment in a body placed in an examination region of the apparatus; an r.f. antenna system for use in exciting and/or detecting magnetic resonance in said body comprising two sub-systems each comprising current sheet means extending generally in a direction normal to the direction of said static magnetic field, first connection means for making electrical connection to one end of said current sheet means, and a return path means for r.f. current extending between second connection means adjacent said one end of said current sheet means and a position adjacent the end of said current sheet means opposite said one end; and an r.f. feed path means extending between the first and second connection means of each sub-system and an r.f. transmitter and/or receiver of the apparatus; said two sub-systems being positioned on opposite sides of said examination region with said current sheet means in facing relationship and so that an r.f. voltage applied simultaneously to both said sub-systems via said r.f. feed path means produces a current in one said current sheet means which is in the opposite direction to the current produced in the other said current sheet means.

According to a third aspect of the invention there is provided a method of examining a body using magnetic resonance techniques comprising: disposing the body in a static magnetic field; positioning adjacent said body an r.f. antenna system comprising two sub-systems each comprising current sheet means extending generally in a direction normal to the direction of said static magnetic field, first connection means for making electrical connection to one end of said current sheet means, and a return path means for r.f. current extending between second connection means associated with said first connection means and a position adjacent the end of said current sheet means opposite said one end; providing an r.f. feed path between the first and second connection means of each sub-system and an r.f. transmitter and/or receiver; and utilising said antenna system and said r.f. transmitter and/or receiver to excite and/or detect magnetic resonance in said body; the sub-systems being positioned on opposite sides of said body with the current sheet means in facing relationship and being so arranged that an r.f. voltage applied simultaneously to both said sub-systems via said r.f. feed path produces a current in one said current sheet means which is in the opposite direction to the current produced in the other said current sheet means.

Several r.f. antenna systems and a method and apparatus in accordance with the invention will now be described, by way of example, with reference to the accompanying drawings in which:

FIGS. 5A to 5E, 6A, 6B, 7A, 7B and 8A to 8F are diagrams illustrating various possible forms of two subsystems of the antenna system;

FIGS. 9A and 9B illustrate a further feature of the antenna sub-systems; and

Figure 1:
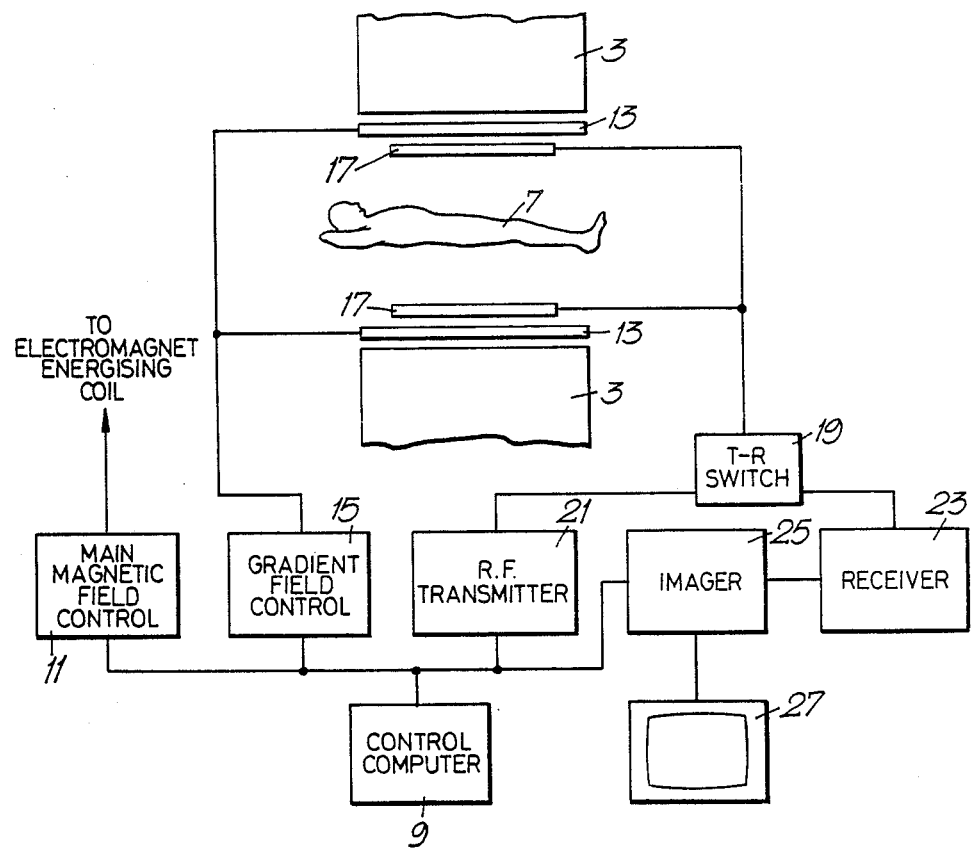
FIG. 1 is a schematic diagram of the apparatus.
Figure 2:
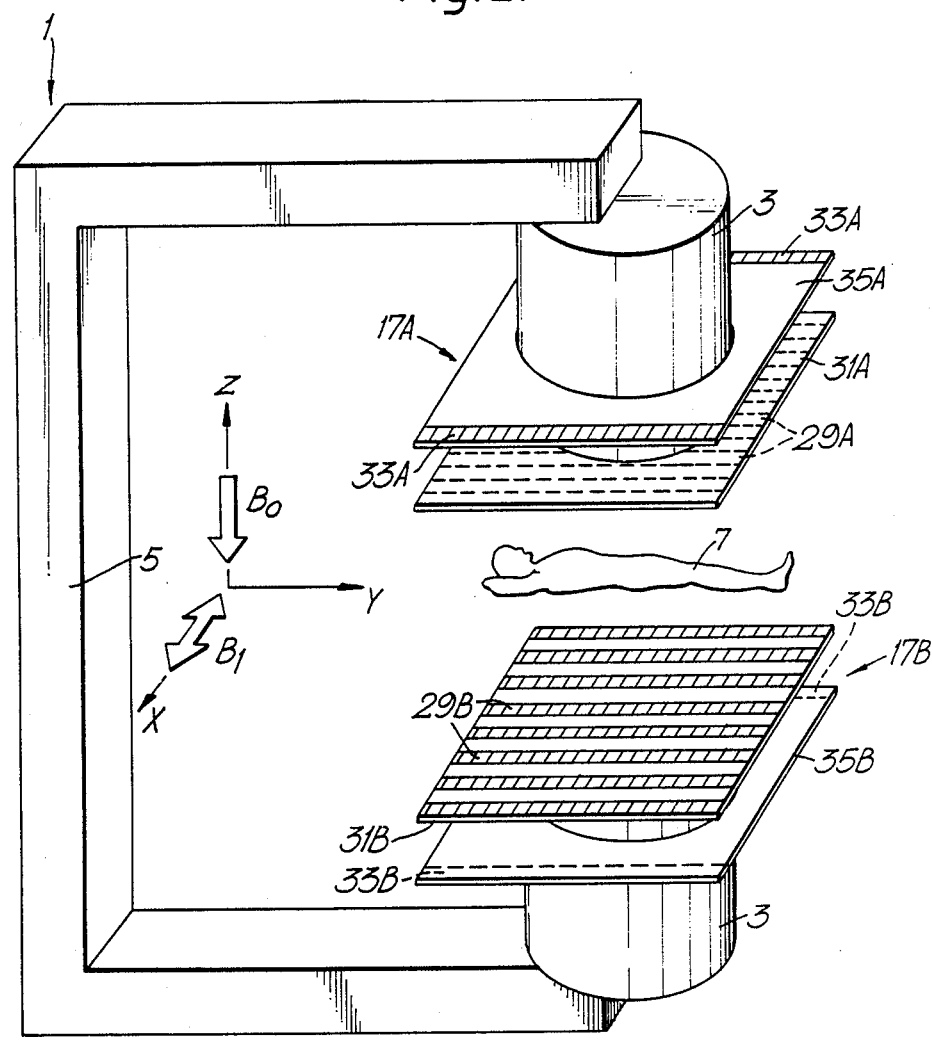
FIG. 2 is a diagrammatic perspective view of a magnet and r.f. antenna system employed in the apparatus.

Referring to FIGS. 1 and 2, the apparatus, which is a magnetic resonance imaging apparatus, includes an electromagnet 1 which produces a strong uniform static main magnetic field Bo across a gap between two pole pieces 3 of the electromagnet 1, the pole pieces 3 being joined by a yoke 5 carrying an energising coil (not shown). In use of the apparatus a body 7 to be imaged, e.g. a patient, is placed in the gap between the pole pieces 3 on a suitable support (not shown). The strength of the field in the gap between the pole pieces 3, and hence in the body 7, is controlled by a computer 9 via a main magnetic field control means 11 which controls the supply of energising current to the electromagnet energising coil.

The apparatus further includes a gradient coil system 13 whereby a gradient may be imposed on the static magnetic field in the gap between the pole pieces 3 in any one or more of three orthogonal directions x, y and z. The coil system 13 is energised by a gradient field control means 15 under control of the computer 9.

The apparatus further includes an r.f. antenna system 17.

The antenna system 17 is selectively connectable by way of a transmit-receive switch 19 either to an r.f. transmitter 21 or a receiver 23. The transmitter 21 is operated under control of the computer 9 to apply r.f. field pulses to the body 7 for excitation of magnetic resonance in the body 7. R.f. signals resulting from magnetic resonance excited in the body are sensed by the antenna system 17 and passed via the receiver 23 to an imager 25 which under control of the computer 9 processes the signals to produce signals representing an image of the body 7. These signals are, in turn, passed to a display device 27 to provide a visual display of the image.

In operation of the apparatus the field provided by the electromagnet 1 defines an equilibrium axis of magnetic alignment in the body 7.

To obtain an image of a selected region, e.g. a cross-sectional slice of the body, an r.f. field pulse is first applied to the body 7 by means of the r.f. transmitter 21 and antenna system 17 to excite magnetic resonance in the selected region. To this end the antenna system 17 produces a field B1 in a direction orthogonal to the static field direction so as to tip the spins of nuclei in the selected region from the direction of the static field into a plane orthogonal to the static field direction. To restrict excitation to the selected region the r.f. field pulse is applied in conjunction with magnetic field gradients imposed by the coil system 13, the frequency of the r.f. field being chosen in conjunction with the magnitudes and directions of the imposed gradients so that the Larmor frequency of chosen protons in the body, e.g. hydrogen protons, is equal to the r.f. field frequency only in the selected region.

The r.f. signals resulting from excitation are then spatially encoded by application of one or more further gradient magnetic fields in known manner, detected by the antenna system 17 and processed to produce an image.

Normally a number of excitation and signal detection sequences are required to produce sufficient data to produce a satisfactory image.

Referring now to FIG. 2, the antenna system 17 comprises two sub-systems 17A and 17B each positioned adjacent a respective one of the pole pieces 3, and hence on opposite sides of the body 7 when the body is placed in the examination region, i.e. in the gap between the pole pieces 3.

Each sub-system 17A or 17B comprises a current sheet means in the form of an array of parallel, equal width, equally spaced electrically conducting strips 29A or 29B, e.g. in the form of metallised coatings, carried on one main face of a sheet 31A or 31B of electrically insulating material. Each sheet 31A or 31B is disposed closely parallel to the face of a respective one of the pole pieces 3 in a plane normal to the direction of the field Bo produced by the magnet 1 in the gap between the pole pieces 3, the two sheets 31A and 31B being in register with their sides carrying the strips 29 in facing relationship.

Each sub-system 17A or 17B further comprises a return current path means in the form of two electrically conducting strips 33A or 33B carried on one main face of a sheet 35A or 35B of electrically insulating material; one extending along each of two opposite edges of the sheet 35A or 35B. Each sheet 35A or 35B is positioned closely parallel and in register with the other sheet 31A or 31B of the sub-system 17A or 17B of which it forms part, on the side of the other sheet 31A or 31B remote from the examination region, and with its strips 33A or 33B parallel to the strips 29A or 29B on the other sheet 31A or 31B and facing away from the other sheet 31A or 31B. To accommodate the pole pieces 3 each sheet 35A or 35B has a central aperture.

Figure 3:
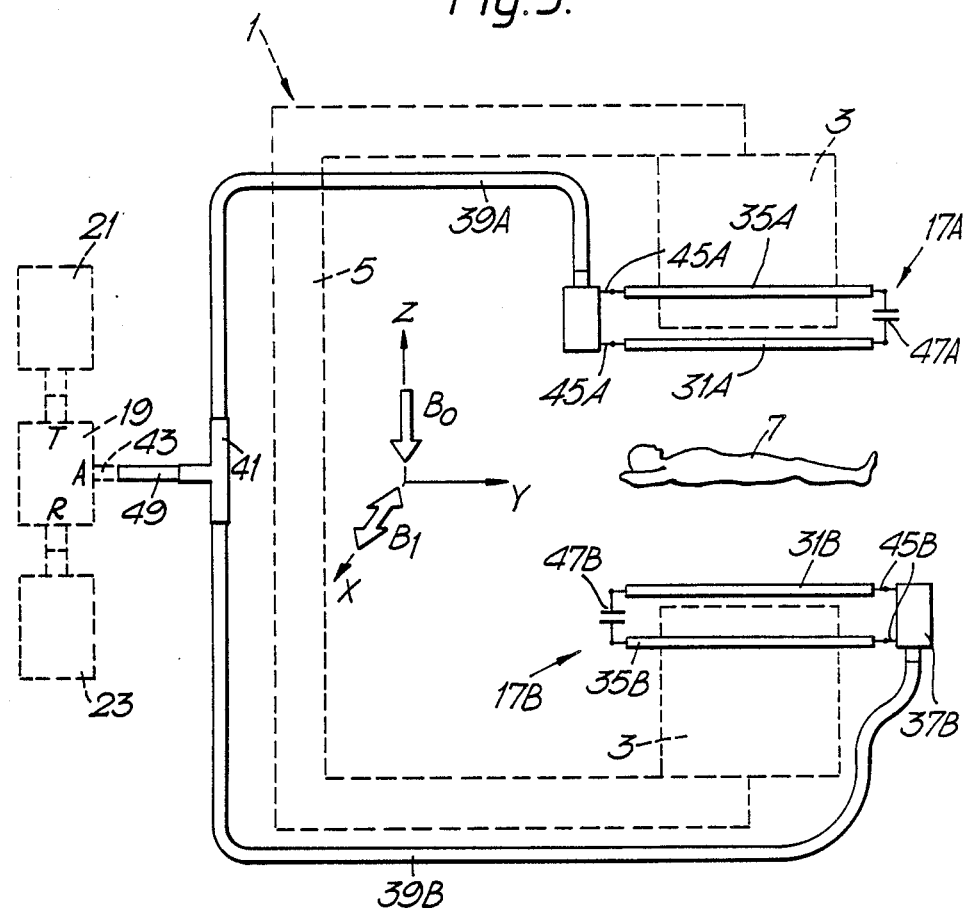
FIG. 3 is a diagram of the magnet and antenna system of FIG. 2 illustrating the connection of the antenna system to an r.f. transmitter and receiver.

Referring now to FIG. 3, each antenna sub-system 17A or 17B is connected by way of a respective tune-match network 37A or 37B, coaxial cable 39A or 39B, and a T-connector 41, to an antenna port 43 of the T-R switch 19, each network 37A or 37B being connected via suitable first and second connection means 45A or 45B between one end of each of the strips 29A or 29B and the corresponding end of both of the strips 33A or 33B of the associated sub-system 17A or 17B. A terminating capacitance 47A or 47B is connected between the other ends of the strips 29A or 29B and other ends of the strips 31A or 31B of each sub-system 17A or 17B.

In operation of the apparatus each sub-system 17A, 17B together with its terminating capacitance 47A or 47B operates as a transmission line tuned to the desired resonance frequency by the associated tune-match network 37A or 37B and presenting a characteristic impedance Z1 to the associated coaxial cable 39A or 39B which has the same characteristic impedance. The impedance presented at the port of T-connector 41 connected to the antenna port 43 of the T-R switch 19 is thus Z1/2, and Z1 is therefore chosen to be equal to twice the impedance Z2 presented by the apparatus at the port 43, the port 43 being connected to the T-connector 41 via a short length of coaxial cable 49 of impedance Z2.

Figure 4:
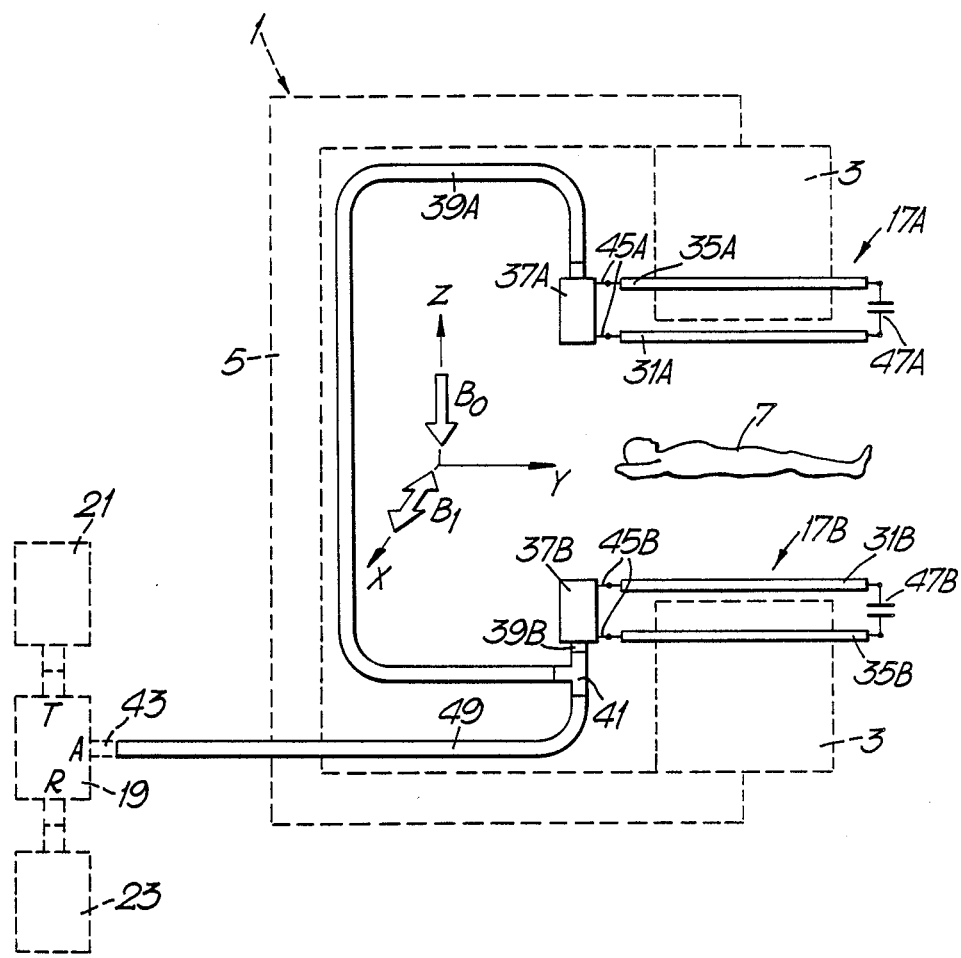
FIG. 4 is a diagram illustrating a method of connection of the antenna system alternative to that shown in FIG. 3.

The two antenna sub-systems 17A, 17B are fed via their associated coaxial cables 39A, 39B from the transmitter 21 so that the current produced in the strips 29A of sub-system 17A is in the opposite direction to the current produced in the strips 29B of sub-system 17B. To this end the coaxial cables 39A, 39B may be either of the same electrical length and connected to oppositely positioned ends of the sub-systems 17A, 17B as shown in FIG. 3, or may differ in electrical length by half a wavelength at the operating frequency and be connected to corresponding ends of the sub-system 17A, 17B as shown in FIG. 4.

By reason of the difference in the directions of the currents produced by the transmitter 21 in the strips 29A, 29B both antenna sub-systems 17A and 17B produce r.f. field in the body 7 in the same sense in the x-direction. Hence, when sensing r.f. fields produced by magnetic resonance, the voltages produced at the receiver 23 by the two sub-systems 17A, 17B are of the same polarity.

FIGS. 5, 6 and 7 illustrate various different forms which the current sheet means of the sub-systems 17A, 17B may take.

Thus the current sheet means instead of comprising equally spaced parallel strips 29 of equal width, as shown in FIG. 5B, may comprise a single conductive area 51 extending over the whole area of its supporting sheet 31, as shown in FIG. 5A.

Alternatively, the current sheet means may comprise equally spaced parallel strips 53 of different widths, as shown in FIG. 5C.

In a further alternative the current sheet means may comprise strips 55 of equal width whose spacing increases towards their centres, as shown in FIG. 5D, or strips 57 of equal width whose spacing decreases towards their centres as shown in FIG. 5E.

Furthermore, whilst in the arrangements of FIG. 5 each current sheet means and its supporting sheet 31 are planar and of generally rectangular outline, in other arrangements they may be curved convexly or concavely towards the examination region, as illustrated at 59A, 59B and 61A, 61B in FIGS. 6A and 6B respectively, and may be other than generally rectangular in outline e.g. of generally circular or elliptical outline.

Figure 7A:
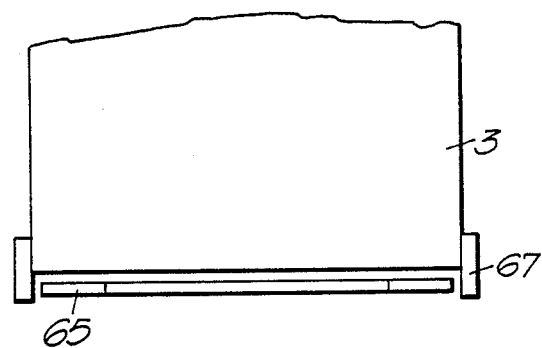
Figure 7B:
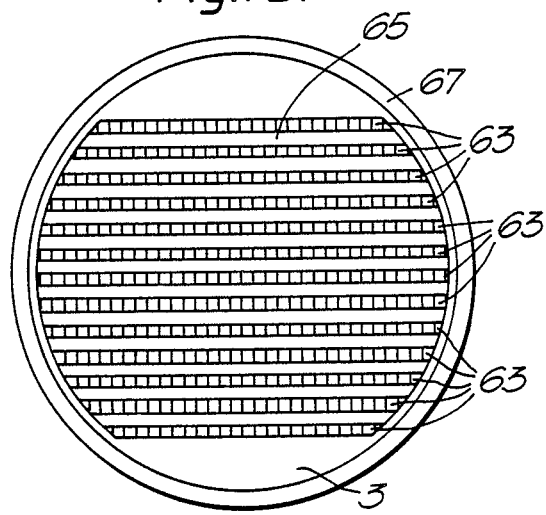

FIGS. 7A and 7B illustrate one particular such arrangement wherein the current sheet means associated with each pole piece 3 comprises equally spaced parallel strips 63 of equal width supported on a sheet 65 of part-circular outline accommodated within a recess formed by an upstanding peripheral rim 67 extending around the edge of the face of the associated pole piece 3, such a rim being commonly provided to improve static field uniformity in the examination region.

It will be understood that the various alternative arrangements of the antenna sub-system current sheet means described above all produce r.f. field distributions somewhat different from one another, and a particular system will thus be selected for use in a particular apparatus accordingly.

The return path means of the sub-systems 17A, 17B may similarly take various forms as illustrated in FIG. 8.

Figure 8A:
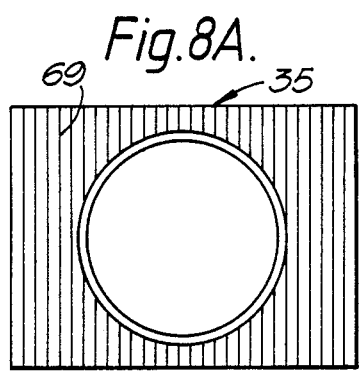
Figure 8D:
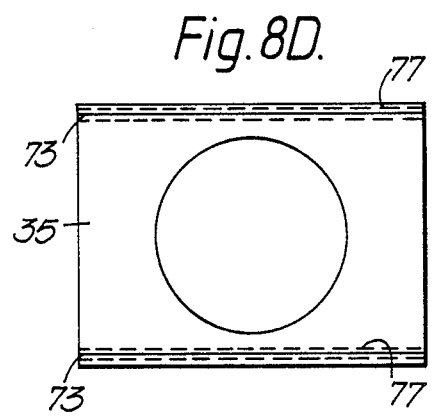
Figure 8B:
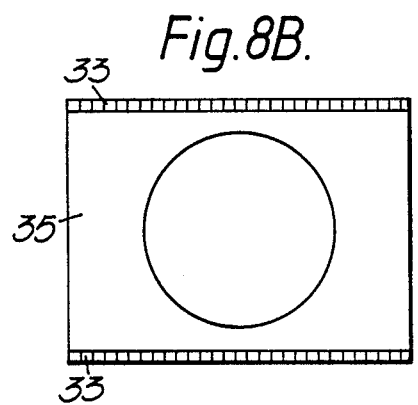

Thus, the return path means instead of comprising two parallel spaced strips 33 on an insulating sheet 35 as shown in FIG. 8B, may comprise a single large area conductor 69 as shown in FIG. 8A.

Figure 8E:
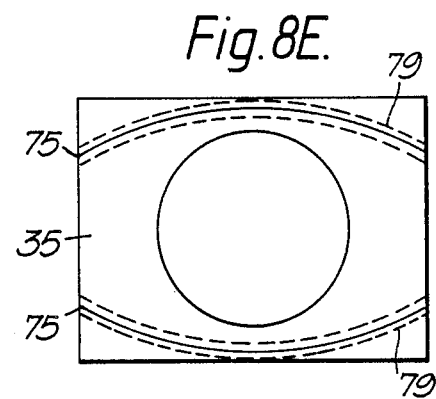
Figure 8C:
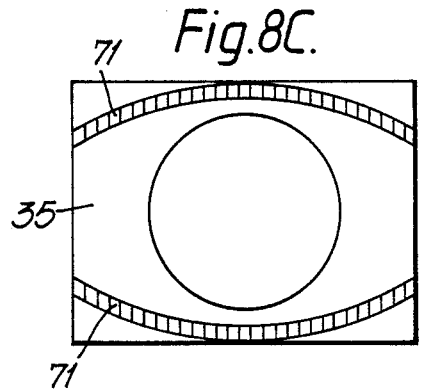

In an alternative arrangement the return path means may comprise two spaced strips 71 whose spacing increases towards their centres as shown in FIG. 8C.

In modifications of the arrangements of FIGS. 8B and 8C the strips 33 or 71 may be surrounded by an electrical screen, in which case the strips are suitably replaced by wires 73 or 75, as shown in FIGS. 8D and 8E, so as each to form effectively a coaxial cable with their screen 77 or 79.

Figure 8F:
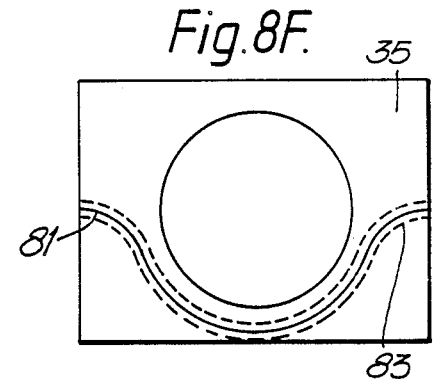

In still further alternative arrangements, illustrated in FIG. 8F, the return path means comprises a single wire, strip or the like conductor 81, which may be surrounded by a screen 83.

Where the return path means if screened as illustrated in FIGS. 8D, 8E and 8F, the return path means may be positioned anywhere convenient instead of behind the current sheet means with respect to the examination region.

It will be appreciated that whilst the arrangements shown in FIGS. 5, 6,7 and 8 are adapted for use with poles of circular cross-section, other arrangements may be adapted for use with poles of different cross-section e.g. elliptical or rectangular.

Referring now to FIG. 9, the terminating capacitances 47A, 47B may comprise a single capacitor 85 as shown in FIG. 9A. Alternatively, several capacitors 87 may be used as shown in FIG. 9B. The terminating capacitors 85 and 87 may be made variable for tuning purposes, if desired. Furthermore the termination of the transmission lines constituted by the antenna systems need not be purely capacitive, and may for example comprise an open or short circuit.

It will be appreciated that an antenna system according to the invention provides much improved access to a patient or other body under examination compared with conventional generally tubular r.f. antenna systems, both where the magnet arrangement providing the static magnetic field is tubular, and when a so-called transverse magnet arrangement, as described by way of example, is used.

Figure 10:
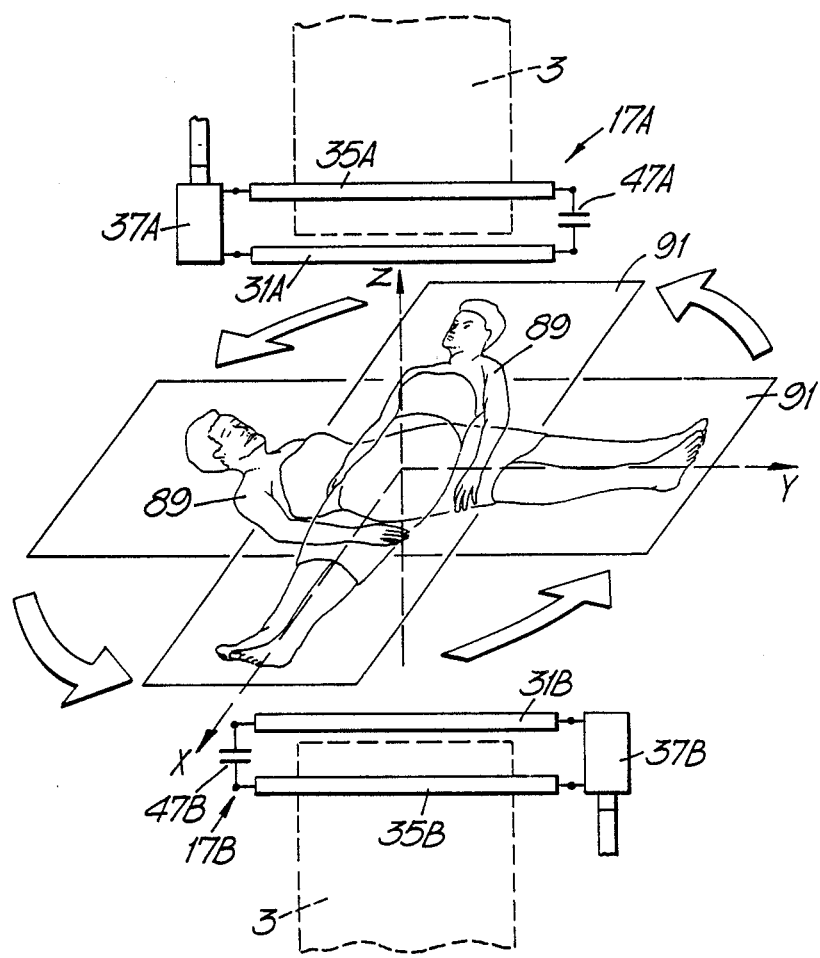
FIGS. 10 and 11 are diagrams illustrating possible variations in the position of a body under examination in use of the apparatus.
Figure 11:
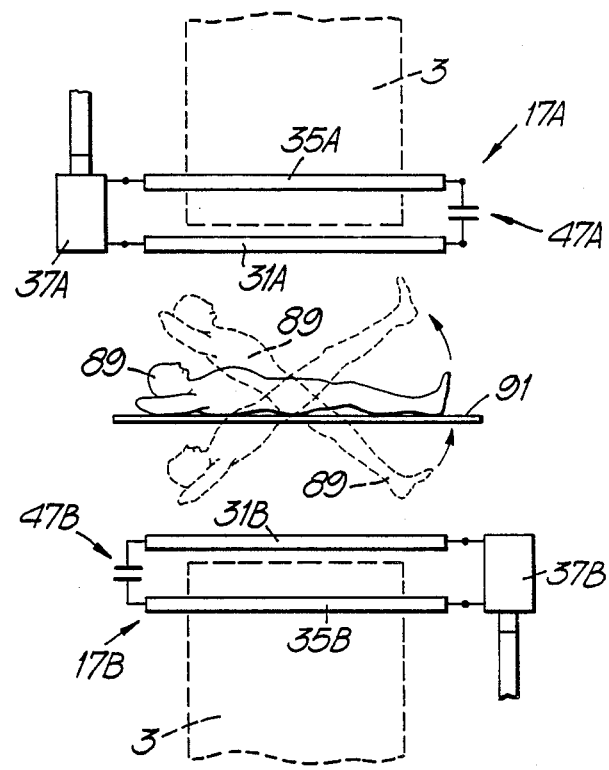

However, where a transverse magnet arrangement is used, the invention further confers the advantages of a very large degree of freedom in respect of patient placement into the examination region and patient orientation during examination. For example, as illustrated in FIG. 10, a patient 89 on a support platform 91 may be positioned during imaging with his or her head-to-toe direction at any desired orientation in the x-y plane, and, as illustrated in FIG. 11, with suitably spaced pole pieces 3, a high degree of variation of the angle of the patient's head-to-toe axis to the z-axis is possible. These freedoms facilitate examination of special regions of interest of a patient in the part of the static magnetic field of highest quality i.e. uniformity. Furthermore, they free the designers of patient handling systems from the constraints imposed by the possibility of introducing a patient into the examination region in a particular direction only.

It will be understood that whilst in the arrangements described above by way of example an electromagnet is used to produce the required static magnetic field, in other arrangements a permanent magnet may be used. Similarly, both resistive and superconductive electromagnets may be used.

I claim:

1. An r.f. antenna for use in a magnetic resonance method or apparatus, the antenna comprising two sub-systems each comprising: current sheet means; first connection means for making electrical connection to one end of said current sheet means; and a return path means for r.f. current extending between second connection means associated with said first connection means and a position adjacent the end of said current sheet means opposite said one end; said two sub-systems being adapted for respective placement on opposite sides of a body under examination with said current sheet means in facing relationship so that r.f. voltages applied simultaneously between the first and second connection means of said sub-systems cause a current to flow in one said current sheet means which is in the opposite direction to the current caused to flow in the other said current sheet means.

2. An antenna system according to claim 1 wherein each sub-system incorporates a terminating impedance connected between the end of said current sheet means opposite said one end and the corresponding end of said return path means.

3. An antenna system according to claim 2 wherein said terminating impedance is a capacitive impedance.

4. An antenna system according to claim 1 wherein each said current sheet means comprises an array of electrical conductors extending in spaced relationship from said one end of said current sheet means to the other.

5. An antenna system according to claim 4 wherein said conductors are in the form of parallel equally spaced strips of equal width.

6. An antenna system according to claim 4 wherein said conductors are in the form of parallel equally spaced strips of differing widths.

7. An antenna system according to claim 4 wherein said conductors are in the form of strips whose spacing increases towards the centre of the strips.

8. An antenna system according to claim 4 wherein said conductors are in the form of strips whose spacing decreases towards the centre of the strips.

9. An antenna system according to claim 1 wherein each said current sheet means comprises a single conductor of extended area.

10. An antenna system according to claim 1 wherein each said current sheet means is carried on a respective sheet of electrically insulating material.

11. An antenna system according to claim 1 wherein each said current sheet means is planar.

12. An antenna system according to claim 1 wherein each said current sheet means is curved.

13. An antenna system according to claim 1 wherein each said current sheet means is of generally rectangular outline.

14. An antenna system according to of claim 1 wherein each said current sheet means is of circular outline.

15. An antenna system according to claim 1 wherein each said return path means comprises an array of electrical conductors extending in spaced relationship from said second connection means to said position adjacent the end of said current sheet means opposite said one end in a surface in parallel spaced relationship with and in register with the associated said current sheet means.

16. An antenna system according to claim 15 wherein each said return path means comprises two said electrical conductors extending along opposite edges of said surface.

17. An antenna system according to claim 1 wherein said return path means comprises a single conductor of extended area in parallel spaced relationship with and in register with the associated said current sheet means.

18. An antenna system according to claim 1 wherein each said return path means comprises a single conductor in the form of a wire.

19. An antenna system according to claim 18 wherein in each return path means said conductor is surrounded by an electrical screen.

20. An antenna system according to claim 1 wherein each said return path means is carried on a sheet of electrically insulating material.

21. A magnetic resonance apparatus including: means for generating a static magnetic field to define an equilibrium axis of magnetic alignment in a body placed in an examination region of the apparatus; an r.f. antenna system for use in exciting and/or detecting magnetic resonance in said body comprising two sub-systems each comprising current sheet means extending generally in a direction normal to the direction of said static magnetic field, first connection means for making electrical connection to one end of said current sheet means, and a return path means for r.f. current extending between second connection means adjacent said one end of said current sheet means and a position adjacent the end of said current sheet means opposite said one end; and an r.f. feed path means extending between the first and second connection means of each sub-system and at least one of an r.f. transmitter and a receiver of the apparatus, said two sub-systems being positioned on opposite sides of said examination region with said current sheet means in facing relationship and so that an r.f. voltage applied simultaneously to both said sub-systems via said r.f. feed path means produces a current in one said current sheet means which is in the opposite direction to the current produced in the other said current sheet means.

22. An apparatus according to claim 21 wherein said r.f. feed path means provides respective paths of equal electrical length between oppositely positioned ends of said sub-systems and said at least one of a transmitter and a receiver.

23. An apparatus according to claim 21 wherein said r.f. feed path means provides respective paths differing in electrical length by half a wavelength at the frequency of operation of the antenna system between correspondingly positioned ends of said sub-systems and said at least one of a transmitter and a receiver.

24. An apparatus according to claim 21 wherein said means for generating a static magnetic field produces said static magnetic field in a gap between a pair of pole pieces, said gap constituting said examination region.

25. An apparatus according to claim 24 wherein each said current sheet means is accommodated in a recess in a face of a respective one of said pole pieces.

26. An apparatus according to claim 21, the apparatus being a magnetic resonance imaging apparatus.

27. A method of examining a body using magnetic resonance techniques comprising: disposing the body in a static magnetic field; positioning adjacent said body an r.f. antenna system comprising two sub-systems each comprising current sheet means extending generally in a direction normal to the direction of said static magnetic field, first connection means for making electrical connection to one end of said current sheet means, and a return path means for r.f. current extending between second connection means associated with said first connection means and a position adjacent the end of said current means opposite said one end; providing an r.f. feed path between the first and second connection means of each sub-system and at least one of an r.f. transmitter and a receiver; and utilising said antenna system and said at least one of an r.f. transmitter and a receiver to effect at least one of excitation and detection of magnetic resonance in said body; the sub-systems being positioned on opposite sides of said body with the current sheet means in facing relationship and being so arranged that an r.f. voltage applied simultaneously to both said sub-systems via said r.f. feed path produces a current in one said current sheet means which is in the opposite direction to the current produced in the other said current sheet means.

* * * * *